United States Patent [19]
Forbes

[11] Patent Number: 5,732,014
[45] Date of Patent: Mar. 24, 1998

[54] MERGED TRANSISTOR STRUCTURE FOR GAIN MEMORY CELL

[75] Inventor: Leonard Forbes, Corvallis, Oreg.

[73] Assignee: Micron Technology, Inc., Boise, Id.

[21] Appl. No.: 804,179

[22] Filed: Feb. 21, 1997

[51] Int. Cl.⁶ .................................................. G11C 11/24
[52] U.S. Cl. ............... 365/149; 365/189.04; 365/189.01
[58] Field of Search ........................ 365/149, 189.04, 365/189.01, 174, 189.09

[56] References Cited

U.S. PATENT DOCUMENTS

| 4,872,042 | 10/1989 | Maeda et al. | 365/149 X |
| 4,970,689 | 11/1990 | Kenney | 365/189.01 |
| 4,999,811 | 3/1991 | Banerjee | 365/149 |
| 5,007,002 | 4/1991 | Leigh | 365/189.04 |
| 5,066,607 | 11/1991 | Banerjee | 437/52 |
| 5,122,986 | 6/1992 | Lim et al. | 365/189.11 |
| 5,220,530 | 6/1993 | Itoh | 365/189.01 |
| 5,308,783 | 5/1994 | Krautschneider et al. | 437/52 |
| 5,448,513 | 9/1995 | Hu et al. | 365/150 |
| 5,646,903 | 7/1997 | Johnson | 365/189.04 |
| 5,652,728 | 7/1997 | Hosotani et al. | 365/149 X |
| 5,657,267 | 8/1997 | Levi | 365/149 |

OTHER PUBLICATIONS

Cottrell, P., et al., "N–Well Design for Trench DRAM Arrays", *IEEE*, Abstract of Int. Electron Device Meeting, pp. 584–587, (1988).

Ema, T., et al., "3–Dimensional Stacked Capacitor Cell for 16M and 64M DRAMs", *IEDM*, Abstract of Int. Electron Device Meeting, pp. 592–595, (1988).

Kim, W., et al., "An Experimental High–Density DRAM Cell with a Built–in Gain Stage", *IEEE Journal of Solid–State Circuits*, vol. 29, No. 8, 978–981, (1994).

(List continued on next page.)

*Primary Examiner*—David C. Nelms
*Assistant Examiner*—Huan Hoang
*Attorney, Agent, or Firm*—Schwegman, Lundberg, Woessner & Kluth, P.A.

[57] ABSTRACT

A gain memory cell formed by merged n-channel and p-channel field-effect transistors wherein the body portion of the p-channel transistor is coupled to the charge storage node of the memory cell for providing a bias to the body of the p-channel transistor that varies as a function of the data stored by the memory cell. The stored charge is sensed indirectly in that the stored charge modulates the conductivity of the p-channel transistor so that the p-channel transistor has a first turn-on threshold for a stored logic "1" condition and a second turn-on threshold for a stored logic "0" condition. Consequently, a small storage node capacitance can be used, reducing the overall volume of the cell. The gain memory cell has a single internal contact and only two lines are required for operation of the gain memory cell. The internal contact is formed along a sidewall of an isolation trench, minimizing the surface area of the memory cell.

18 Claims, 7 Drawing Sheets

OTHER PUBLICATIONS

Krautschneider, F., et al., "Planar Gain Cell for Low Voltage Operation and Gigabit Memories", *Symposium on VLSI Technology Digest of Technical Papers*, 139–140, (1995).

Kuge, S., et al., "SOI-DRAM Circuit Technologies for Low Power High Speed Multigiga Scale Memories", *IEEE Journal of Solid-State Circuits*, vol. 31, No. 4, 586–591, (Apr., 1996).

Shukuri, S., et al., "A Complementary Gain Cell Technology for Sub-1V Supply DRAMs", *Ext. Abs. of IEEE Int. Electron Device Meeting*, 1006–1008, (1992).

Shukuri, S., et al., "A Semi-Static Complementary Gain Cell Technology for Sub-1 V Supply DRAMs", *IEEE Transactions on Electron Devices*, vol. 41, No. 6, 926–931, (Jun., 1994).

Shukuri, S., et al., "Super-Low Voltage Operation of a Semi-Static Complementary Gain DRAM Memory Cell", *VLSI Tech. Symposium*, 23–24, (1993).

Sunouchi, K., et al., "A Self Amplifying (SEA) Cell for Future High Density DRAMs", *ULSI Research Center, Toshiba Corporation*, 17.1.1–17.1.4, (1991).

Terauchi, M., et al., "A Surrounding Gate Transistor (SGT) Gain Cell for Ultra High Density DRAMs", *VLSI Tech. Symposium*, 21–22, (1993).

Wann, H., et al., "A Capacitorless DRAM Cell on SOI Substrate", *Ext. Abs. IEEE Int. Electron Devices Meeting*, 635–638, (1993).

MERGED TRANSISTOR STRUCTURE FOR GAIN MEMORY CELL

FIELD OF THE INVENTION

The present invention relates generally to semiconductor memory devices, and in particular, the present invention relates to a gain memory cell including a merged transistor structure for semiconductor memory devices, such as dynamic random access memory devices.

BACKGROUND OF THE INVENTION

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

As DRAM devices are projected as operating in the gigabit range, the ability to form such a large number of storage capacitors requires smaller areas. However, this conflicts with the requirement for larger capacitance because capacitance is proportional to area. Moreover, the trend for reduction in power supply voltages results in stored charge reduction and leads to degradation of immunity to alpha particle induced soft errors, both of which require that the storage capacitance be even larger.

In order to meet the high density requirements of VLSI cells in DRAM cells, some manufacturers are utilizing DRAM memory cell designs based on non-planar capacitor structures, such as complicated stacked capacitor structures and deep trench capacitor structures. Although non-planar capacitor structures provide increased cell capacitance, such arrangements create other problems that effect performance of the memory cell. For example, trench capacitors are fabricated in trenches formed in the semiconductor substrate, the problem of trench-to-trench charge leakage caused by the parasitic transistor effect between adjacent trenches is enhanced. Moreover, the alpha-particle component of normal background radiation can generate hole-electron pairs in the silicon substrate which functions as one of the storage plates of the trench capacitor. This phenomena will cause a charge stored within the affected cell capacitor to rapidly dissipate, resulting in a soft error.

Another approach has been to provide DRAM cells having a dynamic gain. These memory cells are commonly referred to as gain cells. For example, U.S. Pat. No. 5,220,530 discloses a two-transistor gain-type dynamic random access memory cell. The memory cell includes two field-effect transistors, one of the transistors functioning as write transistor and the other transistor functioning as a data storage transistor. The storage transistor is capacitively coupled via an insulating layer to the word line to receive substrate biasing by capacitive coupling from the read word line. This gain cell arrangement requires a word line, a bit or data line, and a separate power supply line which is a disadvantage, particularly in high density memory structures.

For the reasons stated above, and for other reasons stated below which will become apparent to those skilled in the art upon reading and understanding the present specification, there is a need in the art for a memory cell structure for dynamic random access memory devices, which produces a large amplitude output signal without significantly increasing the size of the memory cell, and which requires only two lines for operation of the memory cell.

SUMMARY OF THE INVENTION

The present invention provides a gain memory cell comprising a charge storage node, a write transistor and a read transistor. The write transistor couples the charge storage node to a bit line during write operations for charging the charge storage node in accordance with data present on the bit line. The charge storage node is coupled to the body portion of the read transistor for providing a bias for the body portion. The bias establishes a turn-on threshold for the read transistor that is indicative of charge stored by the charge storage node.

In accordance with the invention, the write transistor and the read transistor are formed as a merged structure, so that the surface area of the memory cell is minimized. In one embodiment, the write transistor is an n-channel transistor and the read transistor is a p-channel transistor and the transistors are fabricated using a variation on a silicon-on-insulator (SOI) process. One source/drain region of the n-channel transistor is fabricated to contact, internally, the n-type body of the p-channel transistor. Consequently, no separate contact or external wiring is required to couple the source/drain region of the n-channel transistor to the body of the p-channel transistor. Likewise, the other source/drain region of the n-channel transistor and one of the source/drain regions of the p-channel are located adjacent to one another in the merged transistor structure and are interconnected by a single contact. Preferably, this contact is produced as a sidewall contact on the sidewall of the memory cell which is formed by providing a trench along one side of the memory cell structure. Moreover, two of the ground contacts in the memory cell are made internal to the cell without any external contacts and wiring by establishing ohmic contact to the p-type pedestal upon which the memory cell is fabricated. In addition, the word line has no contacts in the memory cell and functions as the gate for both the transistors that form the memory cell. Thus, the gain memory cell provided by the invention includes only one internal metal contact and requires only two lines, a bit line and a word line, for operation.

In accordance with another aspect of the invention, there is provided a method for operating a gain memory cell of a semiconductor memory device. The method comprises enabling a first transistor to couple a charge storage node of the memory cell to a bit line for writing data to the memory cell, disabling the first transistor to isolate the charge storage node from the bit line, and coupling a second transistor to the charge storage node to make the operating mode of the second transistor dependent upon the charge that is stored by the charge storage node. The second transistor operates in a depletion mode when the data stored by the charge storage node represents a first charge state and the second transistor operates in an enhancement mode when the data stored by the charge storage node represents a second charge state. The difference in operating modes is indicative of the data that is stored by the memory cell.

Further in accordance with the invention, there is provided a method for fabricating a gain memory cell for a semiconductor memory device. The method comprises fabricating a pedestal of a p-type material on a substrate of an electrically conducting material. Then, a p-channel transistor is produced in a first portion of the pedestal, with the p-channel transistor including a body portion, a source region and a drain region. An n-channel transistor is produced in a second portion of the pedestal, with the n-channel transistor including a source region and a drain region and with the drain region of the n-channel transistor being located adjacent to the source region of the p-channel transistor. Then, the source region of the n-channel transistor is connected to the body portion of the p-channel transistor. A conductor is produced on a third portion of the pedestal for interconnecting the source region of the p-channel transistor and the drain region of the n-channel transistor.

DESCRIPTION OF THE PREFERRED EMBODIMENT

In the following detailed description of the preferred embodiment, reference is made to the accompanying drawings which form a part hereof, and in which is shown by way of illustration a specific preferred embodiment in which the invention may be practiced. The preferred embodiment is described in sufficient detail to enable those skilled in the art to practice the invention, and it is to be understood that other embodiments may be utilized and that logical, mechanical and electrical changes may be made without departing from the spirit and scope of the present invention. Also, the terms wafer and substrate used in the following description include any semiconductor-based structure having an exposed silicon surface in which to form the integrated circuit structure of the invention. Wafer and substrate are used interchangeably to refer to semiconductor structures during processing. Both are to be understood as including doped and undoped semiconductors, epitaxial layers of a silicon supported by a base semiconductor, as well as other semiconductor structures well known to one skilled in the art. The following detailed description is, therefore, not to be taken in a limiting sense, and the scope of the present invention is defined only by the appended claims.

Figure 1:
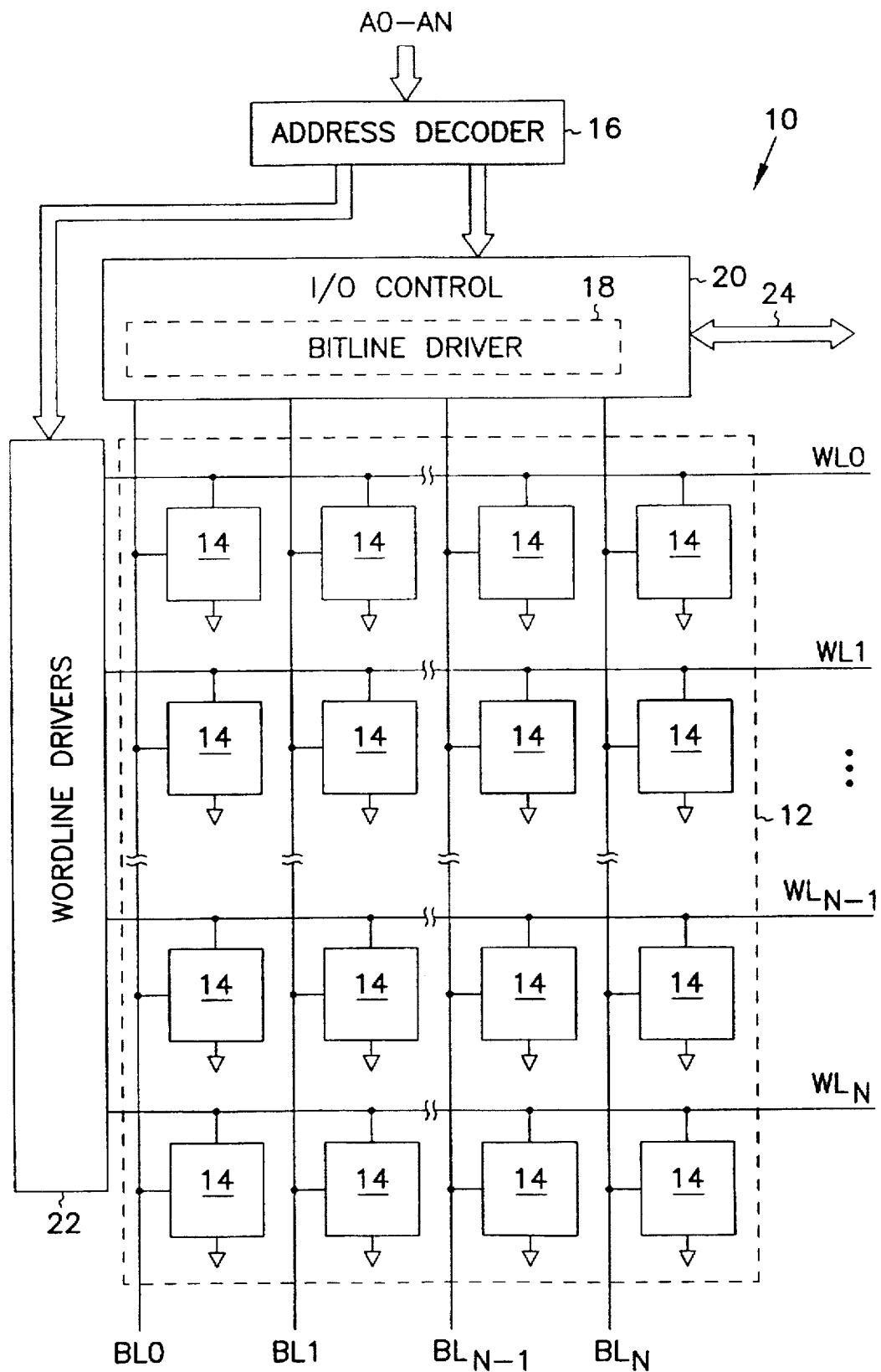
FIG. 1 is a representation of a semiconductor memory device including a matrix of the gain memory cells provided by the invention.

FIG. 1 is a representation of a semiconductor memory device 10 including a matrix or array 12 of the gain memory cells 14 provided by the invention. In the exemplary embodiment, the semiconductor memory device 10 is a dynamic random access memory (DRAM). The basic memory device 10 is well known in the art to include a memory array 12 constructed of rows and columns of memory cells having inputs and outputs corresponding to rows and columns. In the example, the array has N rows and N columns with bit (data) lines BL0, BL1 ... $BL_{N-1}$, $BL_N$, and word (address) lines WL0, WL1 ... $WL_{N-1}$, $WL_N$. The bit lines BL0–$BL_N$ are used to write into the memory cells information provided on input/output lines 24 and to read data from the memory cells for application to the input/output lines 24. The word lines WL0–WLN are used to address or select the memory cell to which data is to be written or read. Address decoder circuits 16 control bit line drivers 18, which comprise a portion of input/output control circuits 20, and word line drivers 22 to access the memory cells of the memory array 12 in response to address signals A0–AN that are provided by an external controller (not shown), such as a standard microprocessor. The input/output control circuits 20 control synchronous or asynchronous data communication between the memory device 10 and external devices. All of the gain memory cells 14 of the memory array 12 are the identical, and accordingly, only one memory cell is described herein.

Gain Memory Cell

Figure 2:
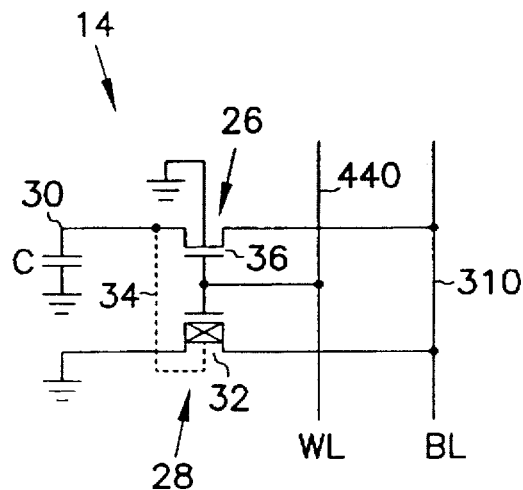
FIG. 2 is a schematic circuit diagram of a gain memory cell provided by the invention.

Referring to FIG. 2, each gain memory cell 14 includes a write transistor 26, embodied as an n-channel field-effect transistor, and a read transistor 28, embodied as a p-channel field-effect transistor 28. The n-channel transistor 26 has a drain electrode connected to the bit line BL, which represents any one of the bit lines BL0, BL1 ... $BL_{N-1}$, $BL_N$, shown in FIG. 1, and a gate electrode formed by the word line WL, which represents any one of the word lines WL0, WL1 ... $WL_{N-1}$, $WL_N$ shown in FIG. 1. The source electrode of transistor 26 is connected to a node 30 which defines a capacitive storage node C for the memory cell. For purposes of clarity, the description of the memory cell makes specific reference to source and drain regions for the two transistors. However, source and drain regions for field-effect transistors are interchangeable and name assignment of the source and drain regions depends on the direction of current flow as is known.

The p-channel transistor 28 has a source electrode connected to the bit line BL, a drain electrode connected to a reference potential, or ground, and a gate electrode formed by the word line WL. The body portion 32 of the p-channel transistor 28 is coupled to the source region of the n-channel transistor 26, as represented by the dashed line 34. The body portion 36 of the n-channel transistor 26 is coupled to the reference potential, or ground.

For low voltage operation, the supply voltage VDD is set to be approximately the forward bias diode voltage of 0.7 volts or less. Thus, the bit line BL swings between ground and the supply voltage VDD, and is normally at ground potential. The word line WL swings between ground and the supply voltage VDD and is normally at maintained at ½ VDD.

Figure 3:
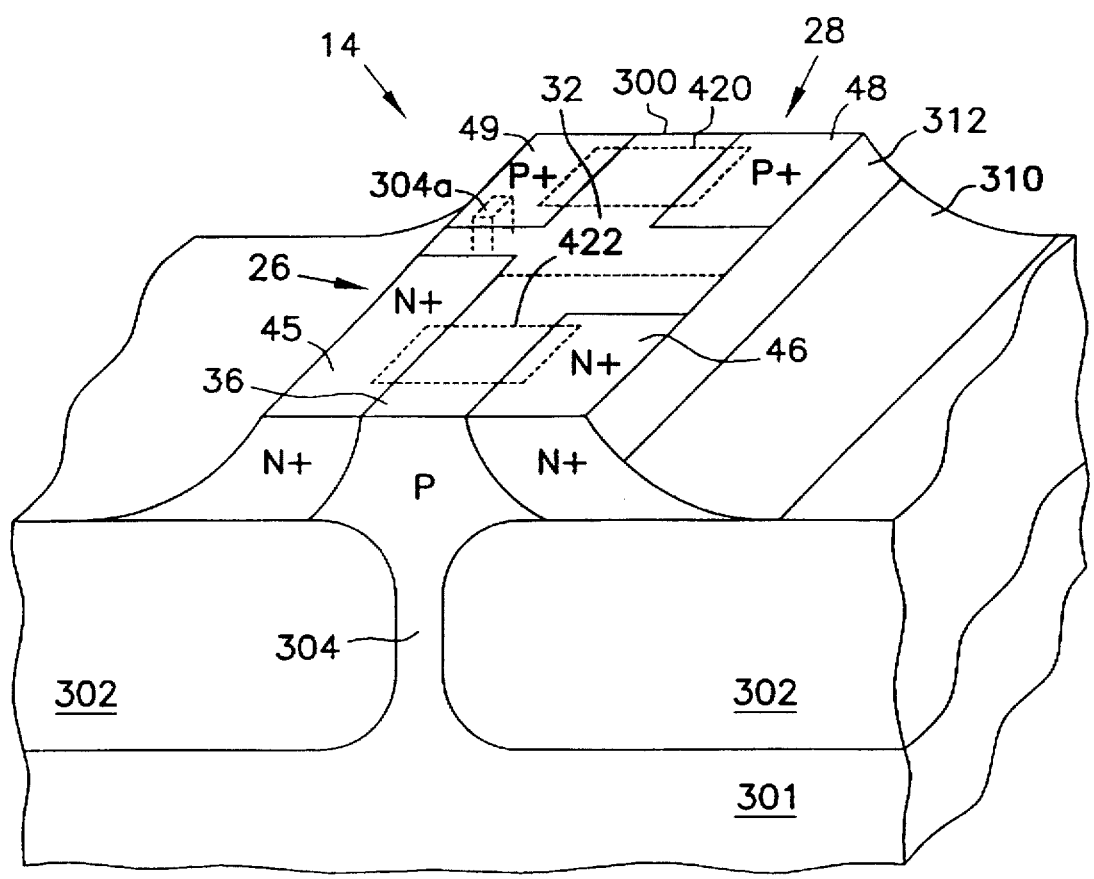
FIG. 3 is a perspective view of the gain memory cell provided by the invention.

FIG. 3 is a perspective view of the gain memory cell 14 provided by the invention, illustrating the individual structure of and the merged nature of the n-channel transistor 26 and the p-channel transistor 28 that form the memory cell. FIG. 3 also shows internal contacts to the transistors. More specifically, the transistors 26 and 28 are fabricated on a pedestal structure including island-like active area portions 300 of substrate 301 of a p-type silicon material. The active area portions 300 are supported by a pedestal portion 304 of the p-type material that forms the substrate 301. An oxide layer 302 isolates the major portion of the silicon island 300 from the main body portion of the underlying substrate 301 as will be shown.

The n-channel transistor 26 includes a body portion 36 that is defined by the p type material, a source region 45 of an n+ type material, and a drain region 46 of an n+ type material. The p-channel transistor 28 includes a body portion 32 of an n-type material, a source region 48 of an p+ type material and a drain region 49 of a p+ type material.

As is shown in FIG. 3, the n+ region 45, which functions as the source region of the n-channel transistor 26 in the exemplary embodiment, is merged into the n-type body 32 of the p-channel transistor 28, thereby making contact with the n-type body of the p-channel transistor internally of the memory cell. This provides the connection, represented by the dashed line 34 in FIG. 2, between the source region 45 of transistor 26 and the body portion 32 of transistor 28. The other n+ region 46, which functions as the drain region of the n-channel transistor 26 in the exemplary embodiment, is fabricated to be located adjacent to the p+ region 48 which functions as the source region of the p-channel transistor 28 in the exemplary embodiment. The drain region 46 of the n-channel transistor is electrically connected to the source region 48 of the p-channel transistor by a single contact provided by a conductor 310 of an electrically conducting material. By way of example, the conductor or contact 310 can be formed of a metal silicide, such as tungsten silicide, that is deposited on a sidewall 312 of the memory cell. The contact 310 is connected to the bitline BL (FIG. 2) which together with the word line WL (FIG. 2), which forms the gates for the two transistors 26 and 28, are the only two lines that are required for operation of the memory cell, if no external capacitance is added to the memory cell. In the exemplary embodiment, no additional capacitance is required because the memory cell has a large gain and amplification of the internal storage capacitance.

Both the drain region 46 of transistor 26 and the source region 48 of transistor 28 are fabricated in a region of the silicon-on-insulator structure where the lightly doped bodies of the transistors are fully depleted. This allows a single contact 310 to be formed along the side wall 312 of the memory cell, contacting both heavily doped regions 46 and 48. The contact 310 is the single contact in the memory cell. Moreover, by virtue of contact 310 being a sidewall contact, i.e., being formed along the sidewall 312 of the memory cell, the memory cell is a three-dimensional cell, minimizing the surface area on the top portion of the memory cell. Consequently, the area of the memory cell can be made very small when a fully self-aligned technology is used in fabricating the memory cell.

The backgate or body portion 36 of the n-channel transistor 26 contacts the pedestal portion 304, which is connected to ground through the substrate 301. Moreover, the layout is such that one of the source/drain regions of the p-channel transistor 28, the p+ drain region 49 of the p-channel transistor 28 in the exemplary embodiment, also contacts the pedestal 304. This ohmic contact between the pedestal 304 and the drain region 49 of the p-channel transistor 28, represented as pedestal portion 304a, shown by dashed lines in FIG. 3, can be provided by a slight asymmetry designed into the pedestal 304 or by a slight misalignment of the n-channel and p-channel transistors with respect to the pedestal. Thus, the pedestal 304 acts as a buried ground line to the memory cell, an effective utilization of backside area in the memory cell. It is pointed out that the pedestal 304 is not so wide as to be located behind the source region 45 of transistor 26, the drain region 46 of transistor 26, or the source region 48 of transistor 28 because this could cause an increase in stray capacitance, and/or an electrical short.

Thus, the n-channel transistor 26 and the p-channel transistor 28 are formed on an island-like portion 300 of a substrate 301 of a silicon. The island-like portion 300 is supported above and isolated from the main body portion of the substrate by a pedestal portions 304 and 304a of the substrate. The body portion 36 of the n-channel transistor 26 and the drain of the p-channel transistor 28 and are in electrically conducting relation with respective pedestal portions 304 and 304a, with the pedestal portion providing a ground connection between the gain memory cell and the main body portion of the substrate.

The wafer 301 on which the transistors 26 and 28 are fabricated is a relatively heavily doped p-type wafer so that the pedestal 304, which acts as a ground contact for the cell, has significant conductivity and low resistance. Likewise, the body dopings of the transistors 26 and 28 are relatively high, to increase the backgate storage capacitance and the stray storage node capacitance on the backgate of the p-channel transistor. Because low voltages are used, i.e., the supply voltage VDD being in the order of one diode drop, or 0.7 volts, there is no concern about diode junction breakdown voltages being low due to the high doping.

Fabrication of the Gain Memory Cell

Figure 4A:
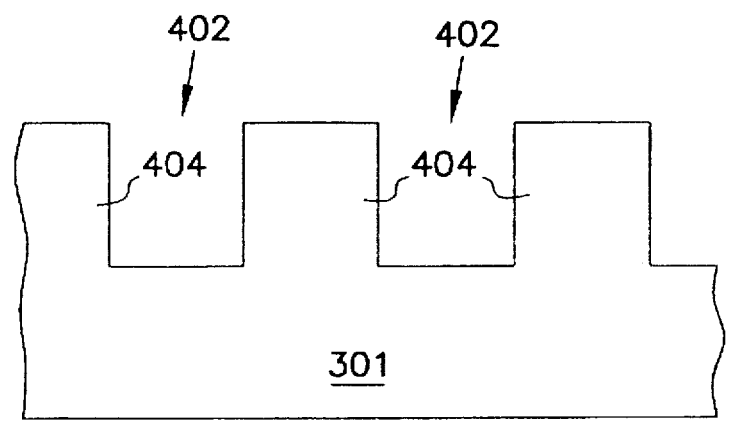
FIGS. 4A–4I illustrate steps in a process for fabricating the gain memory cell structure in accordance with the invention.

FIGS. 4A–4I illustrate steps in a process for producing the gain memory cell structure in accordance with the invention. Referring to FIG. 4A, the silicon substrate or wafer 301 is directionally-etched to form trenches 402, leaving rows or bars 404 of silicon protruding from the substrate 301. The silicon rows 404 can have widths of one micron or less, for example. The depth and width of the trenches 402 can be approximately equal to the width of the silicon bars 404. To form the trenches, the substrate 301 is oxidized at a temperature of approximately 900 to 1,100 degrees Celsius, covered with silicon nitride ($Si_3N_4$), masked and etched to form exposed oxide regions using standard techniques. Then, the exposed oxide regions are etched away with a directional etchant, preferably a reactive ion etch (RIE), forming trenches 402 in the substrate 301.

Then, the substrate 301 is processed to form the silicon island-like active areas 300 (FIG. 3) on which the transistors 26 and 28 are fabricated. Preferably, the silicon islands are produced the method is described in detail in the U.S. patent application Ser. No. 08/706,230 of Leonard Forbes, which is entitled "Technique For Producing Small Islands of Silicon On Insulator" and which is assigned to Micron Technology, Inc. Another method which can be used to form the silicon islands is disclosed in the U.S. patent application Ser. No. 08/745,708 of Wendell P. Noble, which is entitled "Technique For Producing Small Islands of Silicon On Insulator" and which also is assigned to Micron Technology, Inc.

Figure 4B:
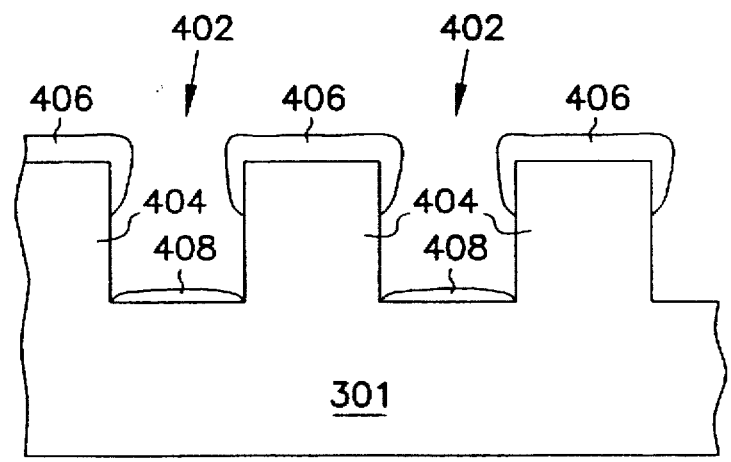

Referring now to FIG. 4B, as is more fully described in the referenced patent application Ser. No. 08/706,230, in producing the silicon islands, first a $Si_3N_4$ cap 406 is formed on the silicon bars 404. The $Si_3N_4$ cap 406 is deposited over the structure using techniques well known in the art, such as chemical vapor deposition (CVD). The $Si_3N_4$ cap 406 forms on the tops of the silicon bars 404 and partly down the sides of the trenches 402. Material overhang at the top of the trench 402 prevents $Si_3N_4$ cap 406 from covering the lower sides of the trenches 402. However, some $Si_3N_4$, represented by reference number 408, is deposited onto the bottom of the trenches 402. A photo resist mask is used to cover the silicon bars 404 and an etch is then used to remove residual $Si_3N_4$ material 408 on the bottom of the trenches 402.

Figure 4C:
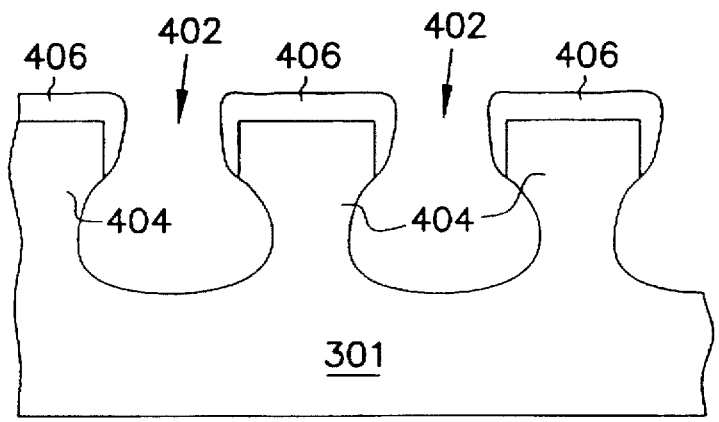

Then, an isotropic chemical etch is used to undercut the bars 404 of silicon as shown in FIG. 4C. A standard chemical etch using hydrofluoric acid (HF) or a commercial etchant sold under the trade name CP4 (a mixture of approximately 1 part (46% HF):1 part (CH$_3$COOH):3 parts (HNO$_3$)) is used for the isotropic etchant. It is important to use an isotropic etch for this step to compensate for the volume of oxide to be formed in the next step. In general, the volume of oxide formed is approximately twice that of the silicon 301 consumed. Undercutting the silicon rows 404, reduces the effective width of the silicon bars 404 to a distance small enough that a relatively short, so that a simple oxidation can almost fully undercut portions of the silicon bars 404, leaving a bar of silicon on a pedestal.

Figure 4D:
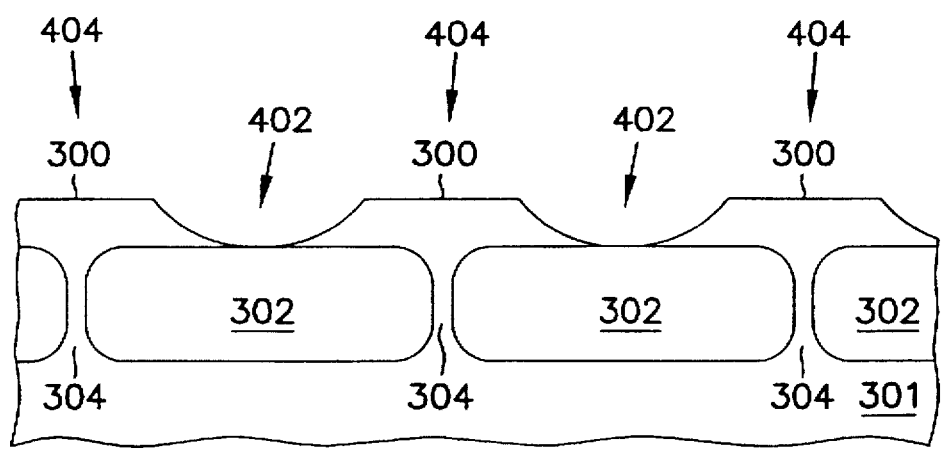
Figure 4E:
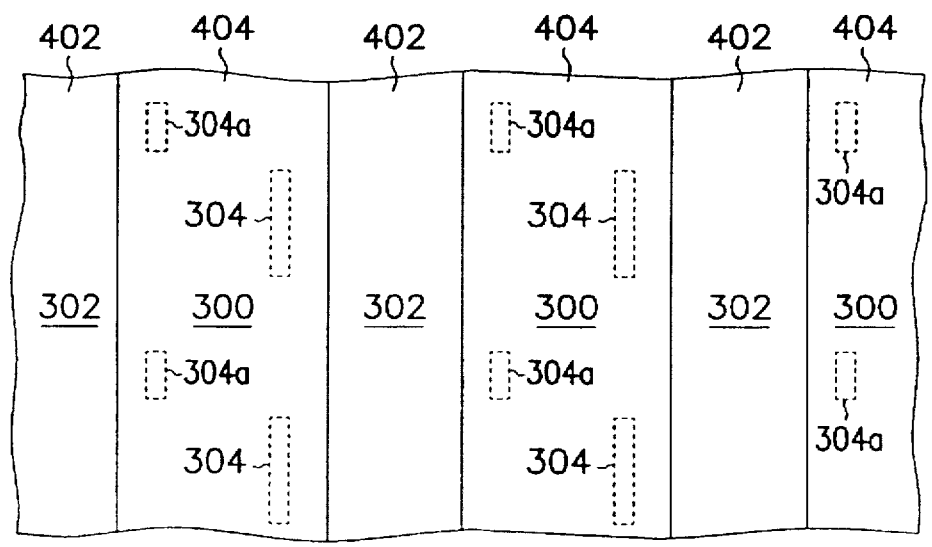

The substrate 301 is oxidized using a standard silicon processing furnace at a temperature of approximately 900 to 1,100 degrees Celsius, followed by stripping of the Si$_3$N$_4$ cap 406, producing the structure shown in FIGS. 4D and 4E. A wet, oxidizing ambient is used in the furnace chamber to oxidize the exposed silicon regions on the lower part of the trenches 402 in a parallel direction to the surface of the substrate 301. The substrate 301 is oxidized for a time period, such that oxide 302 partially undercuts the bottom of the silicon bars 404, producing first portions of the silicon bars from which the island-like active areas 300 of silicon material will be defined in a subsequent process step, which are partially isolated from the substrate by the layer of oxide 302, and second portions of the silicon bars that define the pedestals 304 which support the silicon islands 300 that will be formed and which remain in contact with the substrate. In contrast to the process disclosed in the referenced patent application, in the process according to the present invention, the island-like active areas of silicon subsequently produced are not completely isolated from the substrate 301 by oxidation. A portion of the pedestal 304 is maintained to contact the body of the n-channel transistor 28 and a portion 304a of the pedestal is maintained to be in contact with the drain region 49 of the p-channel transistor 26 that is formed in a subsequent process step, the pedestal portion 304a being shown in FIG. 3 in contact with the drain region 49.

The larger volume of oxide substantially fills the trenches 402 between the silicon bars 404. The time period for oxidation depends on the width of the silicon bars 404 and the effective width after the undercut step. For example, for sub-micron technology, oxidation time is approximately three to four hours. For sub-0.25 micron technology, oxidation time is approximately one hour.

Figure 4F:
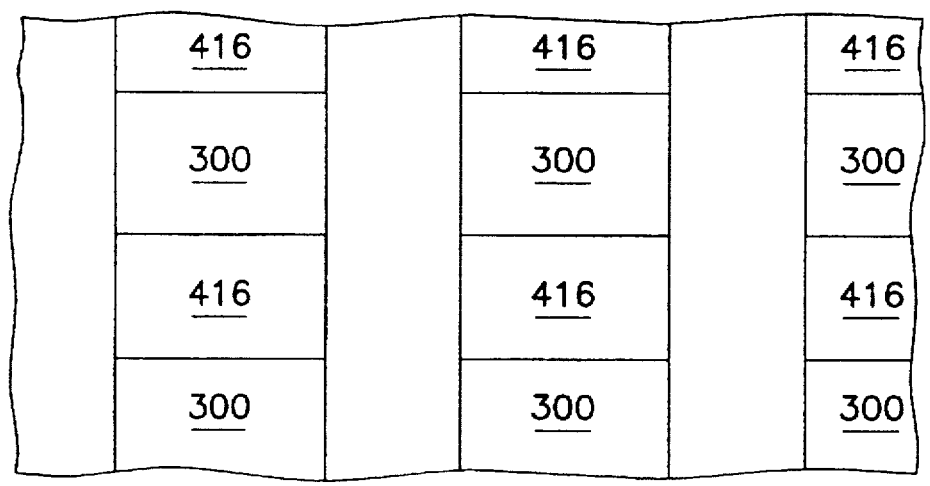

Active areas which define the silicon island-like active areas 300 are then defined on the individual silicon bars 404, using a standard process, such as LOCal Oxidation of Silicon (LOCOS), as shown in FIG. 4F, to form oxide 416 between the active areas 300. Depending on the width of the silicon bars 404, the area of these active areas 300 is approximately one square micron or less for sub-micron technology and approximately 0.0625 square microns or less for sub-0.25 micron technology.

Figure 4G:
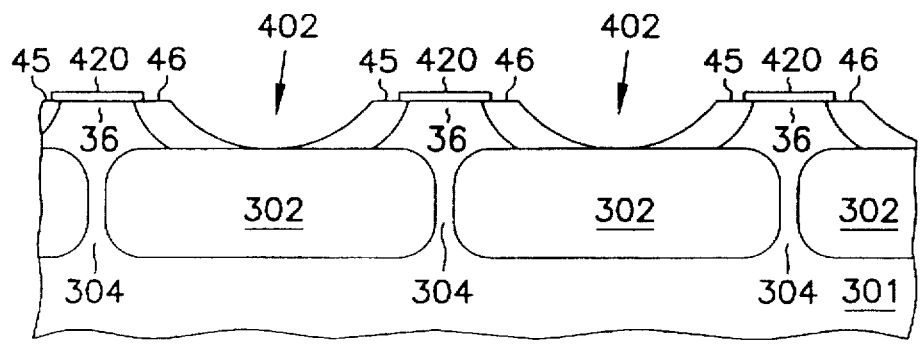
Figure 4H:
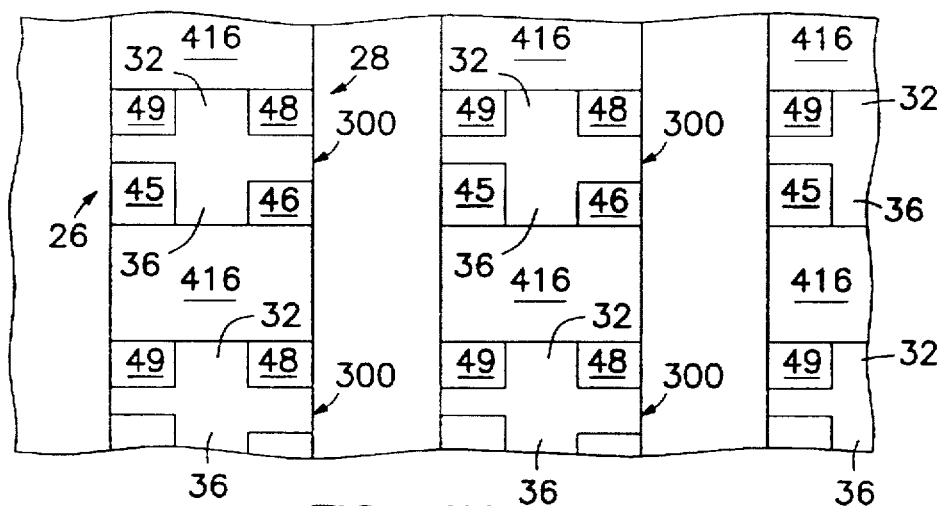

The p-channel transistor 26 and the n-channel transistor 28 are then formed on the resulting silicon islands 300, as shown in FIGS. 4G and 4H, according to methods well known in the art. Referring additionally to FIG. 3, in forming the p-channel transistor 28 on each of the silicon islands, the portion of the silicon island in which the channel region is to be formed is doped with an n-type material and a gate oxide layer 420, shown in FIG. 3, is grown on the body region 32. The source/drain regions 48 and 49 are doped with a p+ material for the p-channel transistor 28. To form the n-channel transistor 26, a gate oxide layer 422 (FIGS. 3 and 4G) is grown on the channel region 36, and the source/drain regions 45 and 46 are doped with an n+ material to form the n+ regions. Note that the n+ source region 45 of transistor 26 is formed to extend into the n+ body region 32 of the p-channel transistor 28.

Figure 4I:
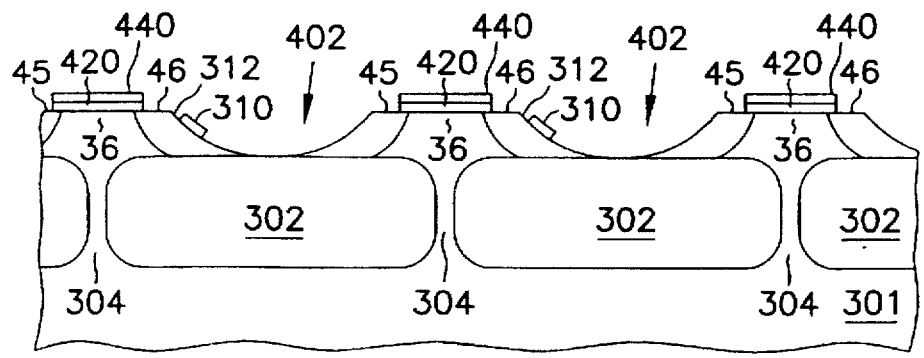

Referring to FIG. 4I, then, the word line conductors 440 are formed by depositing polysilicon or metal on the memory cell structure overlying the gate oxide regions. Also, the bit line conductors 310 are formed by depositing metal on the side wall 312 of the trenches 402. In a subsequent processing step, an oxide spacer 604 (FIG. 6) is produced on the memory cell structure, overlying the drain region 46 and the source region 48 between the word line conductor 440 and the bit line conductor 310 of each memory cell.

Referring to FIGS. 3, 4E and 4I, as has been described, in accordance with the invention, the silicon islands 300 are not completely isolated by the oxide layer 302 because the oxide layer does not extend fully through the pedestal 304. A portion of the pedestal 304 is maintained in contact with the body or backgate region 36 of the n-channel transistor 26 and a portion of the pedestal 304a is maintained in contact with the p+ drain region 49 of the p-channel transistor 28, providing a buried ground line connection to the memory cell. Forming these connections between the body region 36 and the pedestal 304 and between the drain region 49 and the pedestal 304 is facilitated due to the tendency of the p-type dopant, which is boron in the example, to diffuse in silicon faster than other impurity dopants.

Operation of the Gain Memory Cell

Referring again to FIGS. 2 and 3, the n-channel transistor 26 is an enhancement mode device having a threshold voltage of approximately ¾ VDD. The n-channel transistor 26 is normally non-conducting. When the backgate or body portion 32 of the p-channel transistor 28 is at ground or zero potential, the p-channel transistor 28 functions as a depletion mode device and has a threshold voltage level of +¼ VDD. For such condition, the p-channel transistor 38 is on and conducts when the gate electrode of the p-channel transistor 28 is at ground potential, even when the source electrode 48 of the p-channel transistor is at ground potential.

When the storage node capacitance C is charged, the body portion 32 of the p-channel transistor 28 is driven positive, or reversed biased. This makes the threshold voltage of the p-channel transistor 28 more negative so that the p-channel transistor 28 becomes an enhancement mode device. This change in the threshold voltage level of the p-channel transistor 28 is used to read the memory cell. By controlling the backgate or body bias, the threshold voltage of the p-channel transistor 28 becomes large and negative, such as −¼ VDD or larger and more negative. Thus, even when the source electrode of the p-channel transistor 28 is at a small positive voltage, the p-channel transistor does not turn on when the gate electrode is at ground. The application of a positive voltage to the source electrode of the p-channel transistor not only serves to reduce the backgate bias, but also appears as a negative gate-to-source voltage, which tends to turn the transistor on. As such, the swing of the voltage on the source electrode of the p-channel transistor is limited to small positive values, just enough to sense the information stored in the memory cell.

Figure 5:
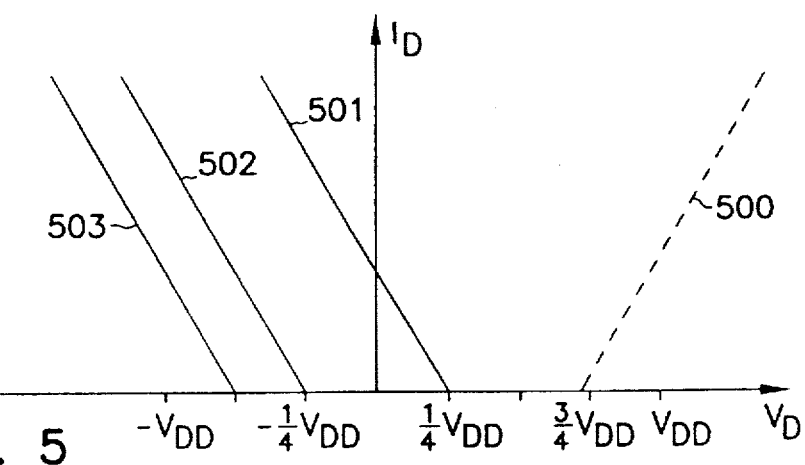
FIG. 5 shows the drain current versus gate voltage for different bias configurations or threshold voltages for the transistors that form the gain memory cell provided by the invention.

This is illustrated in FIG. 5, which shows the drain current versus gate voltage for the n-channel transistor 26 (line 500) and the p-channel transistor 28, (lines 501–503) for different bias configurations or threshold voltages. The n-channel transistor 26, which is a simple enhancement mode device, has a fixed backgate bias and a threshold voltage of approximately ¾ VDD. The drain current increases linearly with the supply voltage VDD as represented by the dashed line 500.

However, the p-channel transistor 28 can have different threshold voltages depending on the source electrode-to-body, or backgate bias. With no backgate or body bias, as represented by line 501, the p-channel transistor 28 is a depletion mode device having a threshold voltage of +¼ VDD. The drain current increases linearly as the supply voltage VDD decreases. Line 502 represents the drain current when a small backgate bias is applied to the body of the p-channel transistor 28. Line 503 represents the drain current for transistor 28 when a large backgate bias is applied to the transistor 28. The transistor 28 is turned off when there is no gate-to-source voltage or gate voltage applied to the transistor.

Referring again to FIGS. 2 and 3, the n-channel transistor 26 is used to write information into the cell. The word line WL normally is at a voltage ½ VDD. When the word line WL is driven to the voltage VDD, the n-channel transistor 26, which has a threshold voltage of ¾ VDD, is turned on, and data present on the bit line BL is written into the memory cell. A logic "1" level is stored by charging the storage node capacitance C to the voltage VDD. This charge is stored on the backgate capacitance C of the p-channel transistor 28. A logic "0" level is stored by discharging the storage node capacitance C to zero potential or ground.

Note that the designation of storing a logic "1" level bit and storing a logic "0" level bit is arbitrary. An "uncharged" condition for the memory cell can represent either a stored logic "1" level bit or a stored logic "0" level bit, with the charged condition representing the complementary condition, i.e., a stored logic "0" level bit or a stored logic "1" level bit, respectively.

The p-channel transistor 28 is used in reading data from the memory cell. The read function provided by the p-channel transistor 28 is best understood by appreciating that the drain electrode of the p-channel transistor 28 is connected to ground. The memory cell 14 is addressed in the read mode when the word line WL is at ground, the p-channel transistor 28 will conduct and couple ground to the bit line BL if the backgate node is not charged, which corresponds to a logic "0" level stored in the memory cell.

If, on the other hand, the backgate or body storage node is charged, which corresponds to a logic "1" level stored in the memory cell, then the turn-on threshold of the p-channel transistor 28 becomes more negative. That is, the p-channel transistor becomes enhancement mode, and in this case has a threshold voltage that is more negative than −¼ VDD, even if the voltage at the source electrode of the transistor 28 is slightly positive.

To read a logic "1" level, the memory cell, the memory cell is addressed by applying ground potential to the word line WL. When ground is applied to the word line WL, the p-channel transistor 28 does not conduct because of the backgate bias provided by the charged storage node. Thus, the bit line BL is not pulled to ground. This difference in conductivity states of the p-channel transistor 28 provides a large gain or amplification of the charge stored in the memory cell.

The source electrode 48 of the p-channel transistor can be at voltages between ground and small positive voltages. The bit line BL normally is at ground potential. If the p-channel transistor 28 turns on during a read operation, the p-channel transistor 28 pulls the bit line BL down to ground so that the bit line BL is maintained at ground potential. If the p-channel transistor 28 is maintained off during a read operation, the bit line BL is pulled positive during the read operation. It is pointed out that the bit line BL is constrained to swing to only small positive voltages which are sufficient for the sense operation.

The memory cell 14 has a very large "charge gain". A small charge stored, or not stored, on the storage node capacitance C results in large current flowing on the bit line. The stored charge itself is not sensed directly. Rather, the stored charged is sensed indirectly in that it modulates the conductivity of the p-channel transistor 28. Consequently, a small storage node capacitance can be used, reducing the overall volume of the cell. Because the volume of the semiconductor material that is associated with the transistors 26 and 28 is small, the memory cell is characterized by a good alpha particle immunity. When the p-channel transistor 28 is conducting during a read operation, a large current flows in the bit line BL, which indicates that a logic "0" level is stored in the cell. The bit line BL is allowed to swing positive only by a small voltage, even if a logic "1" level is stored in the cell so as to not forward bias the backgate of other transistors of the memory array. This could disturb logic "0's" stored in other memory cells of the memory array. If a logic "1" level is stored in the cell, the backgate of the p-channel transistor 28 is reverse biased. Consequently, the p-channel transistor does not turn on when the cell is addressed by the word line WL going to ground potential from the voltage ½ VDD.

Better performance or faster response can be provided by bootstrapping the word line to voltages higher than the supply voltage VDD. For instance, the voltage VDD in the cell array can be only 0.7 volts, but the word line WL can be driven to 1.5 volts when the cell is addressed in the write mode. This will provide more overdrive on the n-channel transistor and a faster write operation. Likewise, during read operations, the word line WL can be pumped to negative voltages like −0.7 volts to turn on the p-channel transistor more strongly when the backgate is not charged and the threshold voltage is +¼ VDD. However, when the backgate is charged, the threshold voltages have to be adjusted to a value that is more negative than −0.7 volts.

The word lines WL can be bootstrapped to a voltage such as 2 VDD, which in the example is about +1.5 volts, or pumped to negative voltages like −2 VDD, or −1.5 volts in the example. If more protection against sub-threshold leakage is desired, the threshold voltages can be separated even further. For instance, the threshold for the n-channel transistor can be adjusted to the voltage VDD (Vtn=+VDD), and the threshold voltage for the p-channel transistor can be adjusted to ground potential (Vtp=0), with no backgate bias. With backgate bias, or with the backgate charged to the voltage VDD, the threshold for the p-channel transistor can be adjusted to values that are more negative than −2 VDD. This will insure that the p-channel transistor is non-conducting when the memory cell is being addressed during a read operation and a logic "1" level is stored in the cell by having the backgate node "B" charged. This can be accomplished by using a higher body doping for the p-channel transistor.

Figure 6:
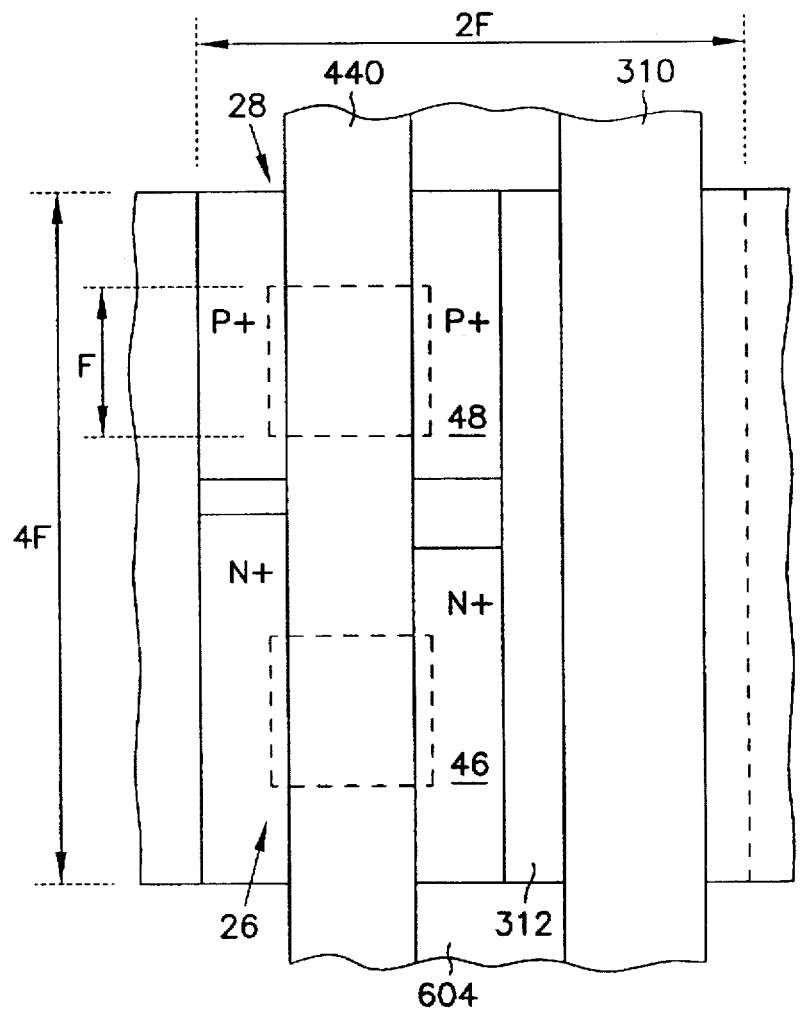
FIG. 6 is a simplified representation of the physical layout of the gain memory cell provided by the invention.

FIG. 6 shows the layout of the memory cell 14. The word line WL through the memory cell is a polysilicon line 440 which serves as the gate electrode for both transistors 26 and 28 through openings (not shown) that are formed down to the thin gate oxide regions of the two transistors. This can be made fully self-aligned to the source/drain regions by standard technology. Another major component of the area of the memory cell is the contact line 310 along the sidewall 312 of the memory cell and which functions as the bit line BL for the memory cell. The bit line BL is partially buried and makes contact along the sloping sidewall 312 of the memory cell. The bit line BL and the word line WL through the memory cell determine the cell width and the bit line and word line can be self-aligned.

The length of the memory cell 14 is determined by the requirement to make two gate areas of minimum dimensions "F", and provide spacing between them and spacing from the ends of the memory cell. In one embodiment, the bit line BL and the word line are separated by an oxide spacer 604 so that the total width of the memory cell is only slightly larger than twice the feature dimension "F". The internal contact is formed along the sidewall 312 of an isolation trench, minimizing the surface area of the memory cell. The net result is that the memory cell is somewhat more than four feature sizes (4F+) in extent.

Consequently, the area of the memory cell is about $8F^2$ in size which corresponds to the size for memory cell designs that employ stacked capacitor arrangements or deep trench capacitors or for known gain cells. However, in the memory cell of the invention, there are no stacked towers of capacitance or deep trenches with capacitors. Also, there is only one contact per cell rather than two as is required for known gain cells. Fabrication of contacts is a major yield detractor in the fabrication of memory cells. Consequently, production of the memory cells in accordance with the invention, which requires only one contact, namely contact 310, is characterized by a much higher yield than is provided by gain cells that require several contacts and more than two lines to provide write and read operations.

The single sidewall contact 310 along the sidewall 312 of the memory cell does not short out the body portions of the n-channel transistor 26 and the p-channel transistor 28. Shorts are possible if and only if there are free carriers present and the source/drain regions in this area are over insulator and the body regions are fully depleted in this area. However, high concentrations of free carriers are present in the very highly doped source/drain regions so the single contact provides a low resistance connection to the source/drain regions of each of the transistors.

SUMMARY

Thus, it has been shown that the invention provides a gain memory cell that is formed by merged n-channel and p-channel field-effect transistors. The gain memory cell has a single internal contact and only two lines are required for operation of the memory cell. In one embodiment, the body portion of the p-channel transistor is coupled to the charge storage node of the memory cell for providing a bias to the body of the p-channel transistor that varies as a function of the data stored by the memory cell. Thus, the stored charge itself is not sensed directly. Rather, the stored charged is sensed indirectly in that it modulates the conductivity of the p-channel transistor so that the p-channel transistor has a first turn-on threshold for a stored logic "1" condition and a second turn-on threshold for a stored logic "0" condition. Consequently, a small storage node capacitance can be used, reducing the overall volume of the cell.

What is claimed is:

1. A gain memory cell comprising:

a charge storage node;

a write transistor for coupling the charge storage node to a bit line during write operations for charging the charge storage node in accordance with data present on the bit line; and a read transistor having a body portion, the charge storage node being coupled to said body portion of the read transistor for providing a bias for said body portion, the bias establishing a turn-on threshold for the read transistor that is indicative of charge stored by the charge storage node.

2. The gain memory cell according to claim 1, wherein the read transistor is operable in a depletion mode when a bias at a first level is applied to said body portion, and the read transistor is operable in an enhancement mode when a bias at a second level is applied to said body portion, the bias being provided at the first and second levels as a function of charge stored by the charge storage node.

3. The gain memory cell according to claim 2, wherein the write transistor has a region merged with said body portion of the read transistor for establishing a connection between said region of the write transistor and said body portion of the read transistor.

4. The gain memory cell according to claim 3, wherein said region of the write transistor is connected to the charge storage node for providing the bias for said body portion of the read transistor.

5. The gain memory cell according to claim 1, wherein the charge stored by the charge storage node modulates the conductivity of the read transistor, the difference in conductivity states of the read transistor providing gain amplification of charge stored by the charge storage node.

6. A gain memory cell comprising:

a first transistor including a body portion of a first conductivity type, said first transistor including a first doped region forming a source and a second doped region forming a drain;

a second transistor including a body portion of the opposite conductivity type, said second transistor including a first doped region forming a source and a second doped region forming a drain;

one of said first and second regions of the second transistor being in contact with the body portion of the first transistor;

the other one of said first and second regions of the second transistor being located adjacent to one of said first and second regions of the first transistor; and a conductor connecting said one doped region of the first transistor to said other one doped region of the second transistor.

7. The gain memory cell according to claim 6, wherein said conductor extends along a sidewall of the memory cell and contacts said one doped region of said first transistor and said other one doped region of said second transistor forming a contact internally of the memory cell.

8. The gain memory cell according to claim 6, wherein the first and second transistors are formed on an island-like portion of a substrate of a material of one of the conductivity types, the island-like portion being supported above and isolated from a main body portion of the substrate by a pedestal portion of the substrate, and wherein the drain of the first transistor and the body portion of the second transistor are in electrically conducting relation with the pedestal portion, with the pedestal portion providing a ground connection between the gain memory cell and the main body portion of the substrate.

9. A gain memory cell comprising:

a p-channel transistor including a body portion, a source region and a drain region;

an n-channel transistor including a source region and a drain region, the source region of the n-channel transistor contacting the body portion of the p-channel transistor, and the drain region of the n-channel transistor being located adjacent to the source region of the p-channel transistor; and a conductor interconnecting the drain region of the n-channel transistor and the source region of the p-channel transistor.

10. The gain memory cell according to claim 9, wherein the p-channel transistor and the n-channel transistor each include a gate electrode formed by a word line for the memory cell.

11. The gain memory cell according to claim 9, wherein the source region of the n-channel transistor is coupled to a charge storage node for the memory cell for providing a bias for the body portion of the p-channel transistor that varies as a function of charge stored by the charge storage node.

12. The gain memory cell according to claim 11, wherein the bias causes the p-channel transistor to operate in a depletion mode for a first charge state for the charge storage node, and the bias causes the p-channel transistor to operate in an enhancement mode for a second charge state for the charge storage node.

13. The gain memory cell according to claim 11, wherein the drain region of the p-channel transistor is connected to a reference potential and the source region of the p-channel transistor is connected to a bit line, the bias allowing the p-channel device to conduct in the absence of stored charge and charge the bit line to a first potential, and the bias maintaining the p-channel transistor non-conducting when charge is stored by the charge storage node, allowing the bit line to charge to a second potential, whereby the state of the bit line is controlled as a function of stored charge stored by the charge storage node during a read operation.

14. A semiconductor memory device comprising:

a memory array including a plurality of gain memory cells;

at least one word line for addressing the memory cells;

at least one bit line for providing a write signal to a memory cell during a write operation and for receiving a read signal from a memory cell during a read operation;

wherein each memory cell includes a charge storage node;

a write transistor for coupling the charge storage node to said bit line during write operations for charging the charge storage node in accordance with data present on said bit line; and a read transistor having a body portion, the charge storage node being coupled to said body portion of the read transistor for providing a bias for said body portion, the bias establishing a turn-on threshold for the read transistor that is indicative of charge stored by the charge storage node.

15. The semiconductor memory device according to claim 14, the read transistor is operable in a depletion mode when a bias at a first level is applied to said body portion, and the read transistor is operable in an enhancement mode when a bias at a second level is applied to said body portion, whereby the operating mode for the read transistor is a function of charge stored by the charge storage node.

16. The semiconductor memory device according to claim 14, wherein said word line functions as the gate electrode for the read transistor and the write transistor of at least one of the memory cells.

17. A method for operating a gain memory cell that includes first and second transistors, comprising:

enabling the first transistor to couple a charge storage node of the memory cell to a bit line for writing data to the memory cell;

disabling the first transistor to isolate the charge storage node from the bit line; and coupling the second transistor to the charge storage node to make the operating mode of the second transistor dependent upon the charge stored by the charge storage node, whereby the second transistor operates in a depletion mode when the charge stored by the charge storage node represents a first logic state and the second transistor operates in an enhancement mode when the charge stored by the charge storage node represents a second logic state.

18. The method according to claim 17, including enabling the second transistor to respond to a read signal and conduct when the second transistor is operating in the depletion mode, and preventing the second transistor from responding to the read signal when the second transistor is operating in the enhancement mode.

* * * * *

UNITED STATES PATENT AND TRADEMARK OFFICE
CERTIFICATE OF CORRECTION

PATENT NO. : 5,732,014
DATED : March 24, 1998
INVENTOR(S) : Leonard Forbes.

It is certified that error appears in the above-identified patent and that said Letters Patent is hereby corrected as shown below:

<u>TITLE PAGE</u>

Please delete the filing date "Feb. 21, 1997" and insert thereto -- Feb. 20, 1997--.

Signed and Sealed this

Twenty-second Day of December, 1998

Attest:

BRUCE LEHMAN

*Attesting Officer*  *Commissioner of Patents and Trademarks*